(12) United States Patent
Wakamiya

(10) Patent No.: US 6,905,980 B2
(45) Date of Patent: Jun. 14, 2005

(54) SEMICONDUCTOR DEVICE AND METHOD OF MANUFACTURING SAME

(75) Inventor: Mikio Wakamiya, Mie-ken (JP)

(73) Assignee: Kabushiki Kaisha Toshiba, Kawaski (JP)

( * ) Notice: Subject to any disclaimer, the term of this patent is extended or adjusted under 35 U.S.C. 154(b) by 0 days.

(21) Appl. No.: 10/625,730

(22) Filed: Jul. 24, 2003

(65) Prior Publication Data
US 2004/0082196 A1 Apr. 29, 2004

Related U.S. Application Data

(62) Division of application No. 09/520,959, filed on Mar. 8, 2000, now abandoned.

(30) Foreign Application Priority Data

Mar. 9, 1999 (JP) .............................. 11-062295

(51) Int. Cl.$^7$ ............................................. H01L 21/469
(52) U.S. Cl. ........................ 438/783; 438/760; 438/761; 438/769; 438/770; 438/773; 438/775
(58) Field of Search ................................ 438/760, 761, 438/769, 770, 773, 775, 783

(56) References Cited

U.S. PATENT DOCUMENTS

| | | | |
|---|---|---|---|
| 5,004,704 A | | 4/1991 | Maeda et al. |
| 5,780,346 A | * | 7/1998 | Arghavani et al. .......... 438/296 |
| 5,811,347 A | * | 9/1998 | Gardner et al. ............. 438/435 |
| 5,861,347 A | * | 1/1999 | Maiti et al. ................. 438/787 |
| 5,943,585 A | * | 8/1999 | May et al. ................... 438/400 |
| 5,959,329 A | * | 9/1999 | Tomita et al. ............... 257/321 |
| 5,985,735 A | * | 11/1999 | Moon et al. ................. 438/435 |
| 5,994,749 A | * | 11/1999 | Oda ............................ 257/411 |
| 6,080,682 A | * | 6/2000 | Ibok ............................ 438/770 |
| 6,087,229 A | | 7/2000 | Aronowitz et al. |
| 6,118,168 A | * | 9/2000 | Moon et al. ................. 257/513 |
| 6,194,784 B1 | | 2/2001 | Parat et al. |
| 6,261,925 B1 | * | 7/2001 | Arghavani et al. .......... 438/437 |
| 6,262,456 B1 | | 7/2001 | Yu et al. |
| 6,294,481 B1 | * | 9/2001 | Inumiya et al. ............. 438/766 |
| 2001/0040252 A1 | | 11/2001 | Kobayashi et al. |

FOREIGN PATENT DOCUMENTS

| | | | |
|---|---|---|---|
| JP | 64-47055 | | 2/1989 |
| JP | 64-047055 | * | 2/1989 |
| JP | 4-239723 | | 8/1992 |

* cited by examiner

Primary Examiner—Andy Huynh
(74) Attorney, Agent, or Firm—Oblon, Spivak, McClelland, Maier & Neustadt, P.C.

(57) ABSTRACT

A semiconductor device is produced by forming a gate oxide film on a silicon substrate, forming a gate electrode on the gate oxide film, forming a nitrogen-containing oxide film on the silicon substrate and gate electrode in an $N_2O$ gas or an NO gas, forming a BPSG film on the nitrogen-containing oxide film, and carrying out a reflow process on the BPSG film in a water vapor atmosphere. During the reflow process, the nitrogen-containing oxide film that has no hydrogen atoms prevents the penetration and diffusion of oxygen and hydrogen atoms into the silicon substrate and gate electrode, thereby preventing the oxidization of the silicon substrate and gate electrode. No hydrogen atoms diffuse into the gate oxide film, and therefore, the reliability of the gate oxide film is secured.

14 Claims, 17 Drawing Sheets

SEMICONDUCTOR DEVICE AND METHOD OF MANUFACTURING SAME

CROSS REFERENCE TO RELATED APPLICATIONS

This application is a Div of Ser. No. 09/520,959 filed Mar. 8, 2000, abandoned.

The subject application is related to subject matter disclosed in Japanese Patent Application No. Hei 11-62295 filed on Mar. 9, 1999 in Japan to which the subject application claims priority under the Paris Convention and which is incorporated herein by reference.

BACKGROUND OF THE INVENTION

1. Field of the Invention

The present invention relates to a semiconductor device having a BPSG (boron-doped phosphorus silicate glass) interlayer insulating film, and particularly, to a method of minimizing the oxidization of a semiconductor substrate and gate electrode during a reflow process.

2. Description of the Related Art

When forming highly-integrated semiconductor devices, it is necessary to minimize the extension of diffusion layers by carrying out a heat treatment at a low temperature within a short time. The highly-integrated semiconductor devices employ fine design rules, and therefore, interlayer insulating films of high aspect ratios must be formed for them without voids. To achieve this, the interlayer insulating films are usually made of BPSG. A BPSG film is easy to carry out a reflow process thereon at a low temperature within a short time. The reflow process is usually carried out in a water vapor atmosphere to decrease the temperature and time of the reflow process. The water vapor atmosphere, however, oxidizes semiconductor regions and gate electrodes, or thickens and varies gate insulating films, or thins and varies the gate electrodes. In addition, hydrogen (H) in the water ($H_2O$) vapor atmosphere diffuses into gate oxide films, to deteriorate the reliability of the gate oxide films.

FIG. 1A is a sectional view showing a semiconductor device before a reflow process. The semiconductor device consists of a silicon substrate 1 on which a gate electrode is formed. A BPSG film is formed on the gate electrode. More precisely, a silicon oxide film 2 serving as a gate insulating film is formed on the substrate 1. On the film 2, there is a lamination of a polysilicon film 3 and a tungsten silicide ($WSi_2$) film 4 serving as the gate electrode. On the film 4, there is an oxide film 5 for protecting the gate electrode. The gate electrode is shaped by photolithography and by anisotropic etching such as reactive ion etching (RIE). The BPSG film 7 is formed over the film 5, an exposed area of the substrate 1, and the side walls of the films 2 to 4. Before forming the BPSG film 7, a silicon oxide film may be formed to prevent boron and phosphorus in the BPSG film 7 from diffusing into the substrate 1 and films 2 and 3. Such a silicon oxide film is incapable of preventing the oxidization of the substrate 1 and films 3 and 4. The top surface of the BPSG film 7 has irregularities corresponding to the height of the films 2 to 5. To flatten the top surface of the BPSG film 7, a reflow process is carried out. At this time, the substrate 1 and films 3 and 4 are oxidized as exaggeratedly shown in FIG. 1B. The substrate 1 is sometimes oxidized to 8 nm from an interface with the BPSG film 7, to form oxidized areas 21. The oxidized areas 21 extend under the edges of the film 2 to thicken the film 2 at the edges. The film 3 is oxidized on the side faces thereof that are in contact with the BPSG film 7 and at edges that are in contact with the film 2. The film 3 is more easily oxidized than the substrate 1, and therefore, the oxidized depth of the film 3 is deeper than that of the substrate 1. The conductivity of the film 3 is lost at the oxidized parts, to shorten an effective gate length. The oxidization at the edges of the film 3 thickens the edges of the film 2. The film 4 is oxidized on the side faces thereof that are in contact with the BPSG film 7. The film 4 is more easily oxidized than the substrate 1, and therefore, the oxidized depth of the film 4 is deeper than that of the substrate 1. The conductivity of the film 4 is lost at the oxidized parts 24, to increase the resistance of the gate electrode.

FIG. 2A is a sectional view showing a semiconductor device before a reflow process. The semiconductor device has a silicon substrate 1 and a double gate electrode. On the silicon substrate 1, a silicon oxide film 2 serving as a gate insulating film is formed. On the film 2, a polysilicon film 3 serving as a floating gate is formed. On the film 3, an oxide film 9 is formed. On the film 9, a lamination of a polysilicon film 10 and a tungsten silicide ($WSi_2$) film 4 is formed to serve as a control gate. On the film 4, an oxide film 12 is formed. A BPSG film 7 is formed on the film 12, an exposed area of the substrate 1, and the side walls of the films 2, 3, 9, 10, and 4. To flatten the top surface of the BPSG film 7, a reflow process is carried out. As exaggeratedly shown in FIG. 2B, the reflow process oxidizes the substrate 1 and films 3, 10, and 4. The oxidized areas 21 of the substrate 1 extend under the edges of the film 2, to thicken the edges. The film 3 is oxidized on the side faces thereof that are in contact with the BPSG film 7 and at edges that are in contact with the films 2 and 9, to shorten the gate length of the floating gate. The oxidized edges of the film 3 thicken the edges of the films 2 and 9. The film 10 is oxidized on the side faces thereof that are in contact with the BPSG film 7 and at edges that are in contact with the film 9, to shorten the gate length of the control gate. The oxidized edges of the film 10 thicken the edges of the film 9. The film 4 is oxidized on the side faces thereof that are in contact with the BPSG film 7. The film 4 is more easily oxidized than the substrate 1, and therefore, the oxidized depth of the film 4 is deeper than that of the substrate 1. The conductivity of the film 4 is lost at the oxidized parts 24, to increase the resistance of the gate electrode.

SUMMARY OF THE INVENTION

To solve the problems, the inventors formed a nitride film, which was considered to prevent the penetration and diffusion of oxygen and hydrogen, between a BPSG film and a semiconductor region and gate electrode. The nitride film prevented the oxidization of the semiconductor region and gate electrode.

However, the nitride film was not always effective to prevent hydrogen from deteriorating the reliability of a gate oxide film. The inventors have continued studies and have found that the reliability of a gate oxide film is deteriorated when hydrogen contained in the nitride film formed around a gate electrode diffuses into the gate oxide film. The nitride film is formed from a material gas containing ammonia ($NH_3$) and dichlorosilane ($SiH_2Cl_2$), and hydrogen (H) contained in the material gas remains in the nitride film.

Based on the finding, an object of the present invention is to provide a semiconductor device that enables a reflow process on an interlayer insulating film such as a BPSG film to be carried out in a water vapor atmosphere without deteriorating the reliability of a gate insulating film of the semiconductor device.

Another object of the present invention is to provide a method of manufacturing a semiconductor device that enables a reflow process on an interlayer insulating film such as a BPSG film to be carried out in a water vapor atmosphere without deteriorating the reliability of a gate insulating film of the semiconductor device.

In order to accomplish the objects, a first aspect of the present invention provides a semiconductor device having a semiconductor substrate, a first insulating film that is formed on a top surface of the semiconductor substrate so that a contact face between them may have two first edges that run in parallel with each other, a conductive film formed on a top surface of the first insulating film so that a contact face between them may have two second edges that run in parallel with the first edges, a nitrogen-containing silicon oxide film having a first face that is in contact with side faces of the first insulating film defined by the first edges, side faces of the conductive film defined by the second edges, and surface areas of the semiconductor substrate defined by the first edges, and a BPSG film formed over the conductive film and on a second face, which is opposite to the first face, of the nitrogen-containing silicon oxide film.

The semiconductor substrate that provide semiconductor regions may be any other semiconductor object such as an epitaxial film or a polysilicon film. The semiconductor substrate is typically made of monocrystalline silicon. The nitrogen-containing silicon oxide film may be any nitrogen-containing oxide film. The nitrogen-containing silicon oxide film is a film in which covalent-bonded silicon and oxygen atoms are replaced with covalent-bonded silicon and nitride atoms at a certain ratio. When heated, oxygen atoms bonded with silicon atoms are replaced with nitrogen atoms. The nitrogen atoms bonded with silicon atoms are hardly replaced with oxygen atoms. A film made of combined silicon and nitrogen atoms is tight with respect to oxygen and hydrogen atoms, and therefore, oxygen and hydrogen atoms are hardly diffused into the silicon-nitrogen film. It is understood that this diffusion preventive effect appears by replacing, in a silicon-oxygen-bonded film, oxygen atoms with nitrogen atoms at a certain ratio. The silicon-oxygen film is coarse with respect to nitrogen atoms, and therefore, nitrogen atoms easily diffuse into the silicon-oxygen film. The diffused nitrogen atoms replace oxygen atoms and bond to silicon atoms. The bonded nitrogen atoms are never replaced with oxygen or hydrogen atoms, thereby preventing the diffusion of oxygen and hydrogen atoms. These facts tell that the oxidization of semiconductor regions and the diffusion of hydrogen during a reflow process on a BPSG film are stoppable by inserting a film that is formed by partly replacing oxygen atoms with nitrogen atoms in a nitride or oxide film. Based on this knowledge, the present invention provides a semiconductor device that enables a reflow process on a BPSG film to be carried out in an oxidizing atmosphere.

According to the first aspect, the nitrogen-containing oxide film may have a peak in a nitrogen concentration distribution in a thickness direction.

The effect of the present invention is realized if nitrogen is distributed, even partly, in the thickness direction of the oxide film laid under the BPSG film. If there is a diffusion preventive part in an oxygen diffusing path, it suppresses the diffusion of oxygen. Namely, if oxygen atoms in an oxide film are partly replaced with nitrogen atoms, the oxide film shows the oxidization preventive effect. The larger a peak in a nitrogen concentration distribution in a nitrogen-containing oxide film, the larger the oxidization preventive effect provided by the film. Even if the amount of nitrogen in an oxide film is small, the film will provide a proper oxidization preventive effect.

A second aspect of the present invention provides a method of manufacturing a semiconductor device, including the steps of forming an insulating film on a semiconductor substrate, forming a conductive film on the insulating film, forming a nitrogen-containing oxide film over the semiconductor substrate, insulating film, and conductive film, forming a BPSG film after forming the nitrogen-containing oxide film, and carrying out a heat treatment in an oxidizing atmosphere after forming the BPSG film.

Even during the heat treatment, i.e., a reflow process in an oxidizing atmosphere, oxidizing seeds such as oxygen atoms hardly diffuse into the nitrogen-containing oxide film, thereby preventing the oxidization of semiconductor regions. Although hydrogen atoms produced from decomposed vapor diffuse into the BPSG film during the heat treatment, they are blocked by the nitrogen-containing oxide film.

The second aspect will be more effective by employing a dinitrogen monoxide ($N_2O$) gas or a nitric monoxide (NO) gas in the step of forming a nitrogen-containing oxide film.

The dinitrogen monoxide gas or nitric monoxide gas contains no hydrogen atoms in their molecular structures, and therefore, no hydrogen remains in the nitrogen-containing oxide film. The nitrogen-containing oxide film for preventing the diffusion of oxidizing seeds may be formed even in a semiconductor device that rejects a nitride film due to hydrogen contained in the nitride film. In this way, the method of the second aspect enables the reflow process on a BPSG film to be carried out in an oxidizing atmosphere.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1A:
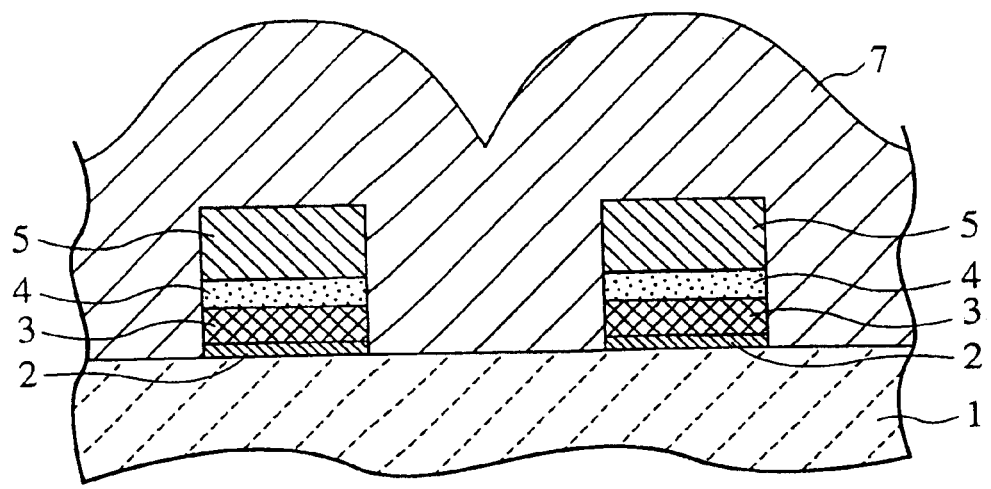
FIGS. 1A and 1B are sectional views showing a semiconductor device according to a prior art before and after a reflow process.
Figure 1B:
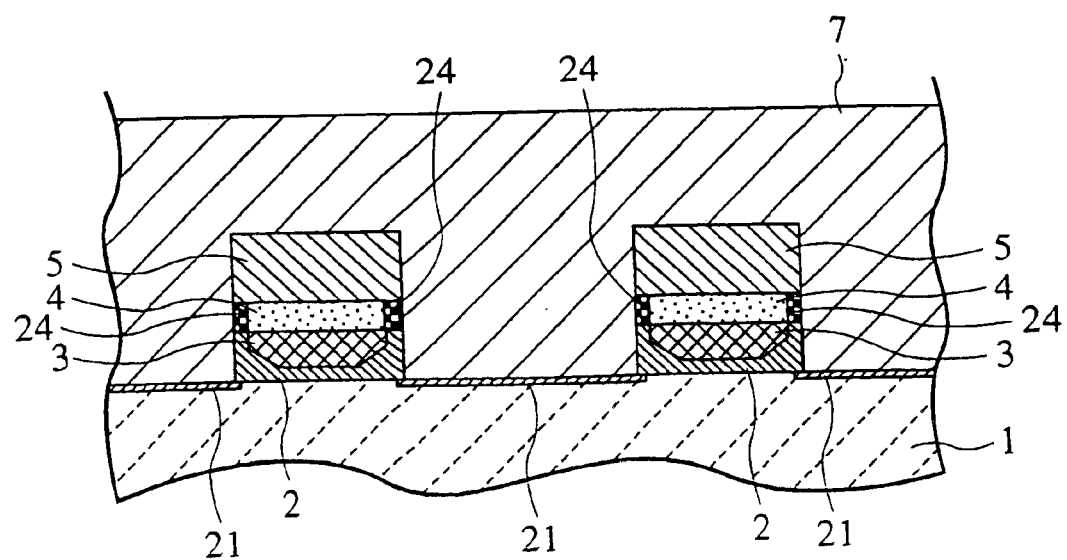
Figure 2A:
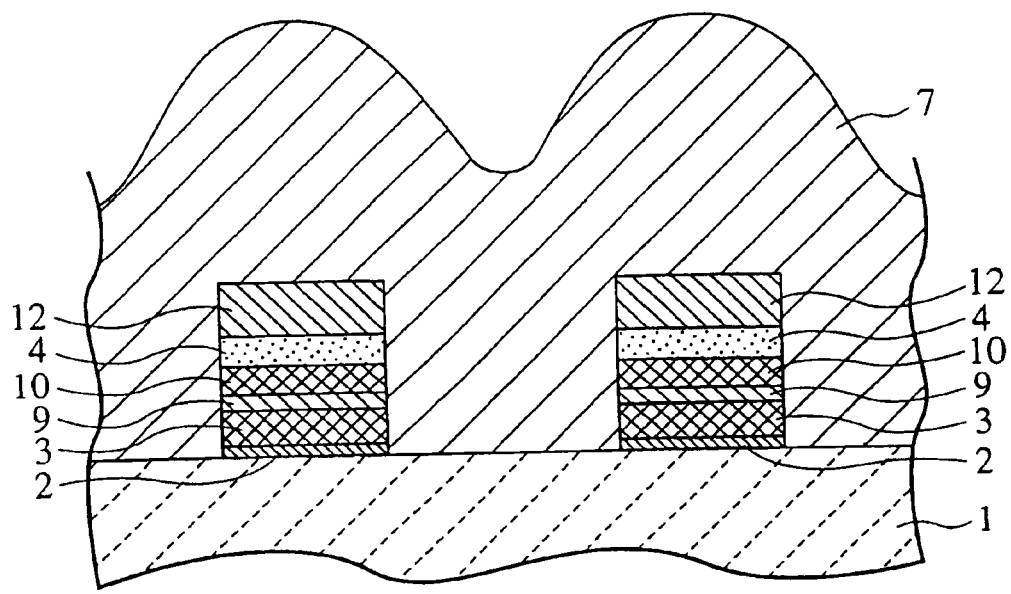
FIGS. 2A and 2B are sectional views showing a flash memory according to a prior art before and after a reflow process.
Figure 2B:
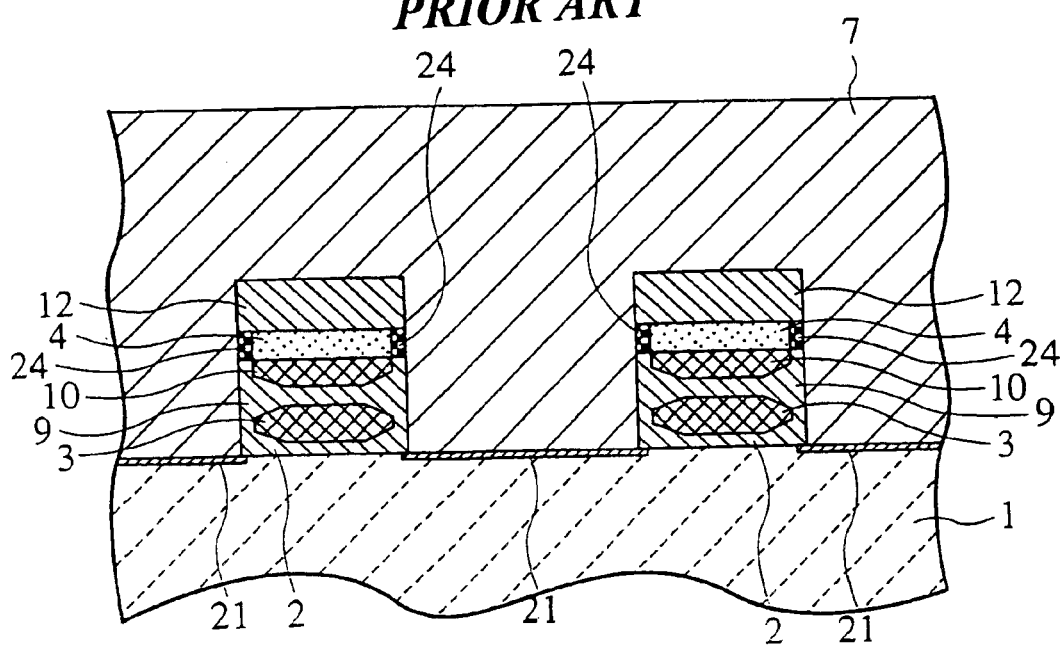

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 3:
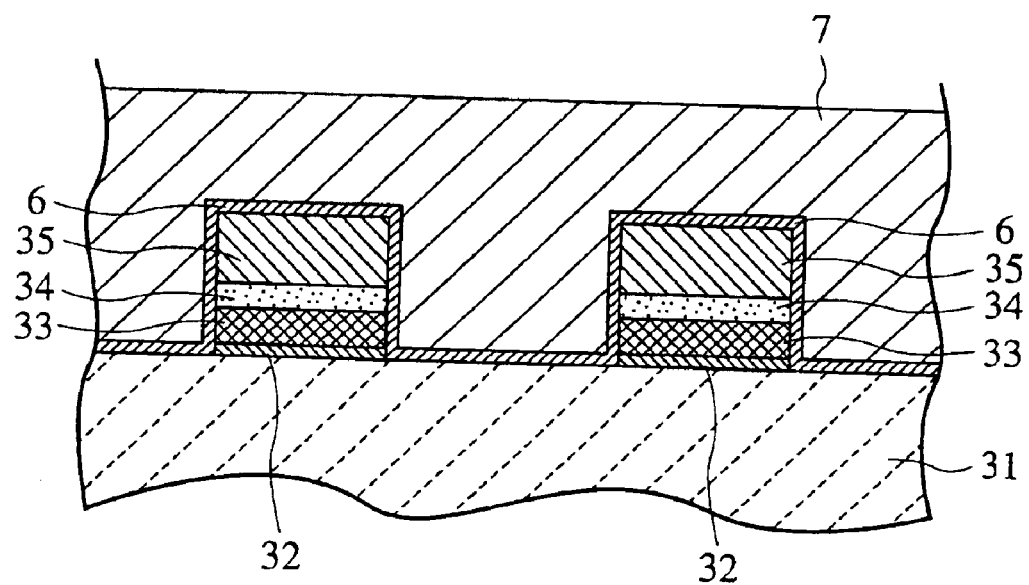
FIG. 3 is a sectional view showing a semiconductor device according to a first embodiment of the present invention.

FIG. 3 is a sectional view showing a semiconductor device according to the first embodiment of the present invention. The semiconductor device has a silicon substrate 31 for providing semiconductor regions, a BPSG film 7 formed over the substrate 1, and a nitrogen-containing oxide film 6 formed between the substrate 31 and the BPSG film 7. Although not shown in FIG. 3, the substrate 31 has active regions and electrode regions for transistors. On the substrate 31, a gate insulating film 32 is formed. On the gate insulating film 32, a gate electrode is formed. The gate electrode consists of a first conductive film 33 made of polysilicon or polycrystalline silicon and a second conductive film 34 made of refractory metal or a silicide of refractory metal. On the gate electrode, a silicon oxide film 35 is formed. The film 35 serves as an ion implanting mask to form an electrode region. To cover the substrate 31 and films 32 to 35, the nitrogen-containing oxide film 6 is formed. On the nitrogen-containing oxide film 6, the BPSG film 7 is formed. The gate insulating film 32 may be a silicon oxide film, a silicon nitride film, or a nitrogen-containing silicon oxide film. The refractory metal may be tungsten (W), titanium (Ti), molybdenum (Mo), cobalt (Co), etc. The silicide of refractory metal may be tungsten silicide ($WSi_2$), titanium silicide ($TiSi_2$), molybdenum silicide ($MoSi_2$), cobalt silicide ($CoSi_2$), etc. The nitrogen-containing oxide film 6 prevents the oxidization of the substrate 31 and films 33 and 34. The film 6 also prevents hydrogen from diffusing into the film 32, or boron and phosphorus from diffusing into the substrate 31 and conductive film 33.

Figure 4:
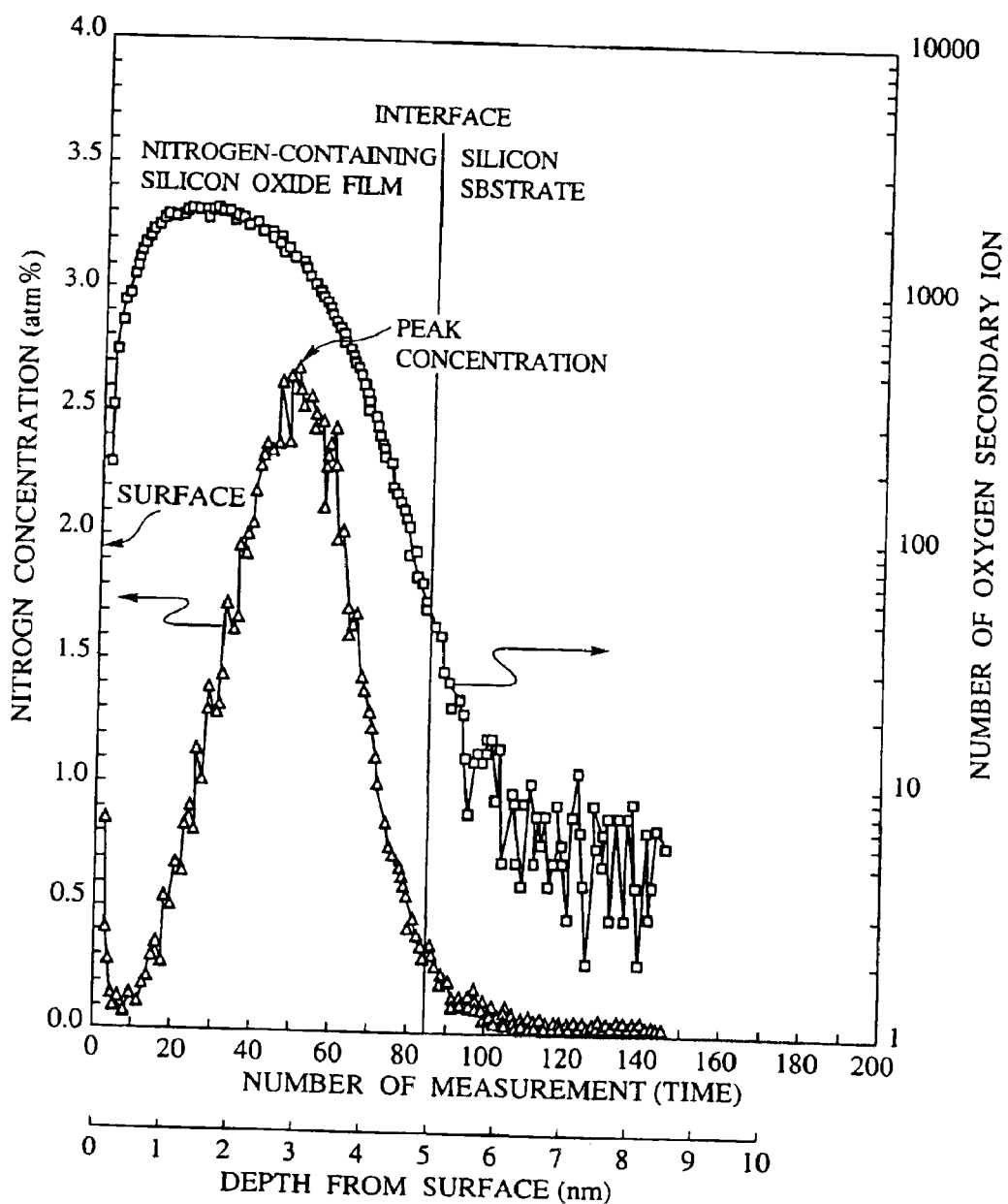
FIG. 4 is a graph showing a nitrogen concentration distribution and a secondary oxygen ion distribution in a depth direction in the semiconductor device of the first embodiment.

FIG. 4 is a graph showing a nitrogen concentration distribution in the nitrogen-containing oxide film 6 and the number of secondary oxygen ions in a depth direction of the semiconductor device of the first embodiment. The graph is based on measurements made by secondary ion mass spectrometry (SIMS) using cesium ions ($Cs^+$) as primary ions. An abscissa represents the depth from an interface between the films 6 and 7 toward the substrate 31 and the number of measurements. An ordinate represents nitrogen concentrations in the film 6 and the numbers of secondary oxygen ions in the semiconductor device. A triangle mark represents a nitrogen concentration in the film 6 and a square mark represents the number of secondary oxygen ions in the semiconductor device. The position of an interface between the film 6 and the substrate 31 in FIG. 4 is determined according to a distribution of the numbers of secondary oxygen ions in the depth direction and the depth of each spattered hole by SIMS. A peak in the numbers of secondary oxygen ions is about 2000 and a detective limit of the number of secondary oxygen ions is 10. The ratio of 2000 to 10 is 200. Accordingly, it is considered that there is no oxidization if the number of secondary oxygen ions is 10 or below. The numbers of secondary oxygen ions drastically drop around the interface between the film 6 and the substrate 31, and it reaches the detective limit of 10 at a depth of 1 nm from the interface. This tells that oxidization caused by a reflow process is substantially stopped by the nitrogen-containing oxide film 6 and advances only to a depth of 1 nm in the semiconductor substrate 31.

The semiconductor device of the first embodiment has a peak in the nitrogen concentration distribution of the nitrogen-containing oxide film 6 in the depth direction of the film 6. The peak is 2.7 atm % and appears at about the center of the film 6. This peak value is about ½₁ of 57 atm % of a silicon nitride ($Si_3N_4$) film of proper stoichiometry. A minimum nitrogen concentration of the film 6 appears at the surface thereof and is 0.1 atm % or below. A half width of the nitrogen concentration profile in the film 6 is constant irrespective of the peak nitrogen concentration or process conditions and is in the range of 1.8 nm to 2.8 nm.

Figure 5:
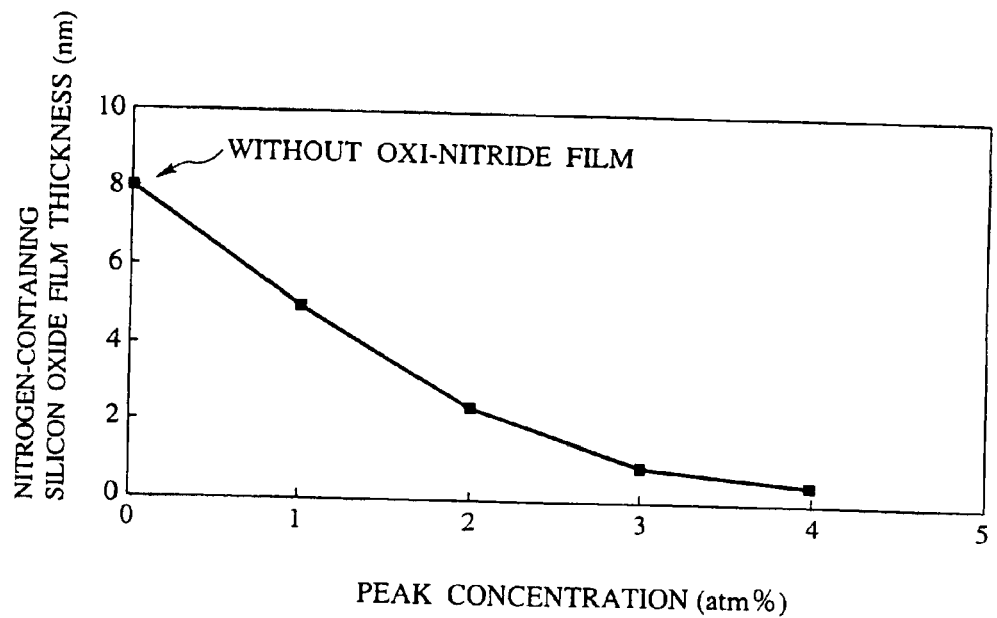
FIG. 5 is a graph showing a relationship between the amount of oxidization by reflow process and a peak nitrogen concentration according to the first embodiment.

FIG. 5 is a graph showing a relationship between the amount of oxidization of the substrate 31 due to a reflow process and a peak nitrogen concentration in the nitrogen-containing oxide film 6 according to the first embodiment. An abscissa represents a peak nitrogen concentration in the film 6 measured by SIMS, and an ordinate represents the amount of oxidization of the substrate 31. A point where the peak nitrogen concentration is 0 atm % corresponds to the amount of oxidization of the substrate 31 without the film 6. In FIG. 5, the thickness of the film 6 is 5 nm. If no nitrogen-containing oxide film 6 is formed under the BPSG film 7, the substrate 31 will be oxidized to about 8 nm. It is understood that even a peak nitrogen concentration of 1 atm % is effective to suppress the oxidization of the substrate 31. If the peak nitrogen concentration is increased to 2 atm %, the oxidization of the substrate 31 is suppressed to 2.5 nm that is about ⅓ value without the film 6. At this time, the total thickness of the film 6 and the oxidized part of the substrate 31 is 7.5 nm that is thinner than that of the oxidized part formed in the substrate 31 when no nitrogen-containing oxide film 6 is prepared. As the nitrogen concentration in the film 6 increases, the amount of oxidization of the substrate 31 decreases. When the peak nitrogen concentration in the film 6 is increased to 3 atm %, the amount of oxidization of the substrate 31 is decreased to about 1 nm. If the peak nitrogen concentration is increased to 4 atm %, the oxidization of the substrate 31 is decreased to about 0.5 nm. This value is substantially equal to a variation in the thickness of the gate oxide film 32, and therefore, is satisfactory for the semiconductor device. It is possible to further suppress the oxidization of the substrate 31 by further increasing the peak nitrogen concentration in the film 6.

A method of manufacturing the semiconductor device of the first embodiment will be explained. The method includes the steps of forming the nitrogen-containing oxide film 6 on the silicon substrate 31 for providing semiconductor regions, forming the BPSG film 7 on the film 6, and heat-treating the BPSG film 7 in an oxidizing atmosphere. The step of forming the film 6 employs an $N_2O$ gas. The details of the method will be explained.

Figure 6A:
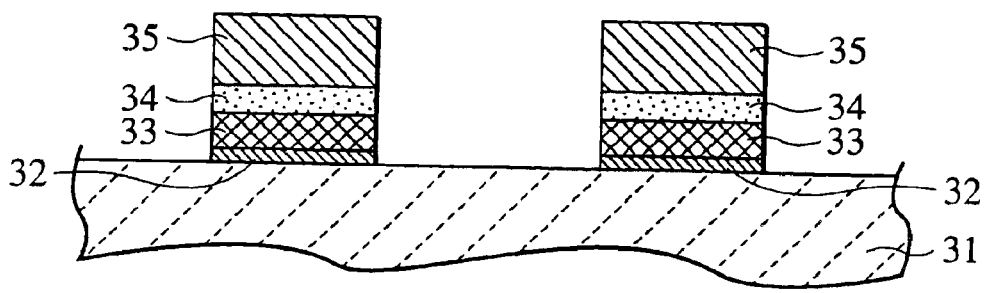
FIGS. 6A to 6C are sectional views showing a method of manufacturing the semiconductor device of the first embodiment.

(1) In FIG. 6A, a thermal oxide film to form the gate insulating film 32 is formed on a silicon substrate 31. A polysilicon film to form the first conductive film 33 is formed by thermal CVD (chemical vapor deposition). A $WSi_2$ film to form the second conductive film 34 is formed by spattering. A silicon oxide film 35 is formed by plasma CVD. A resist film is formed and is patterned by photolithography into gate electrodes. The patterned resist is used to dry-etch the films 32 to 35 by reactive ion etching (RIE).

Figure 6B:
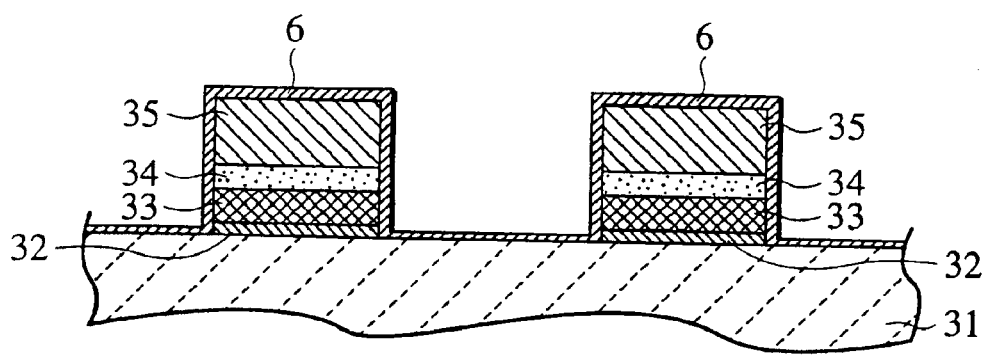

(2) In FIG. 6B, a nitrogen-containing oxide film 6 is formed on the substrate 31 to a thickness of, for example, 5 nm by introducing an $N_2O$ gas at 900° C. and 53.2 kPa into a reactive tube for 30 minutes. Under these conditions, a peak nitrogen concentration of about 2 atm % is realized. The nitrogen concentration is adjustable by changing the film forming pressure, temperature, and $N_2O$ gas supplying time. The film forming temperature is not limited to 900° C. It may be in the range of 600° C. to 1000° C. The film forming pressure may be in the range of 133 Pa to an atmospheric pressure. The film 6 is formed without material gases that contain hydrogen, and therefore, the film 6 never contains hydrogen atoms. The film 6 is formed by nitriding and oxidizing the exposed surfaces of the substrate 31 and films 33 and 34 and by diffusing nitrogen into the side faces of the films 32 and 35.

Figure 6C:
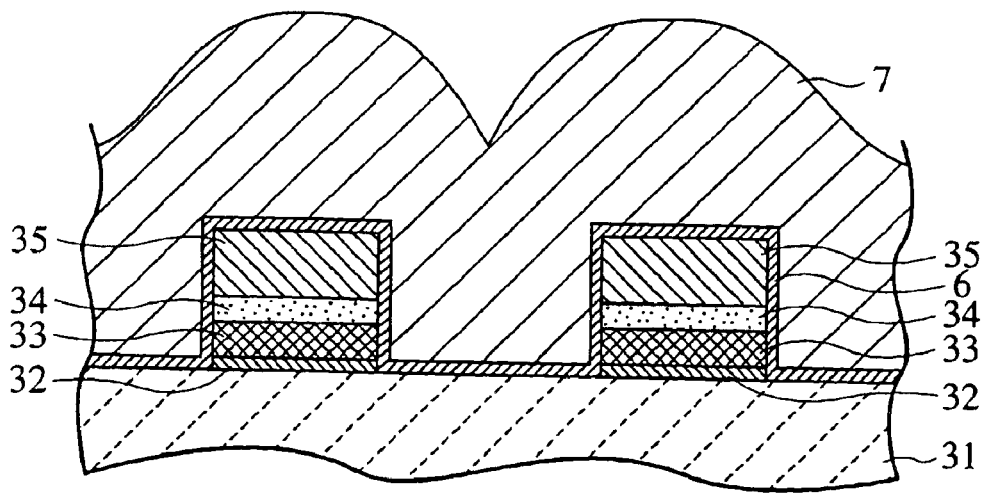

(3) In FIG. 6C, a BPSG film 7 is formed to a thickness of, for example, about 900 nm by thermal CVD. The top surface of the BPSG film 7 has irregularities whose height is substantially equal to the height of the films 32 to 35.

(4) As shown in FIG. 3, a reflow process is carried out at 750° C. in a water vapor atmosphere for 30 minutes. The reflow process liquefies the BPSG film 7, to resolve the irregularities on the top surface thereof. At this time, the nitrogen-containing oxide film 6 under the BPSG film 7 prevents oxidizing seeds from diffusing into an area between the film 6 and the substrate 31 as well as an area between the film 6 and the first conductive film 33. Namely, the film 6 prevents the oxidization of the substrate 31 and the thickening of the gate insulating film 32.

Figure 7:
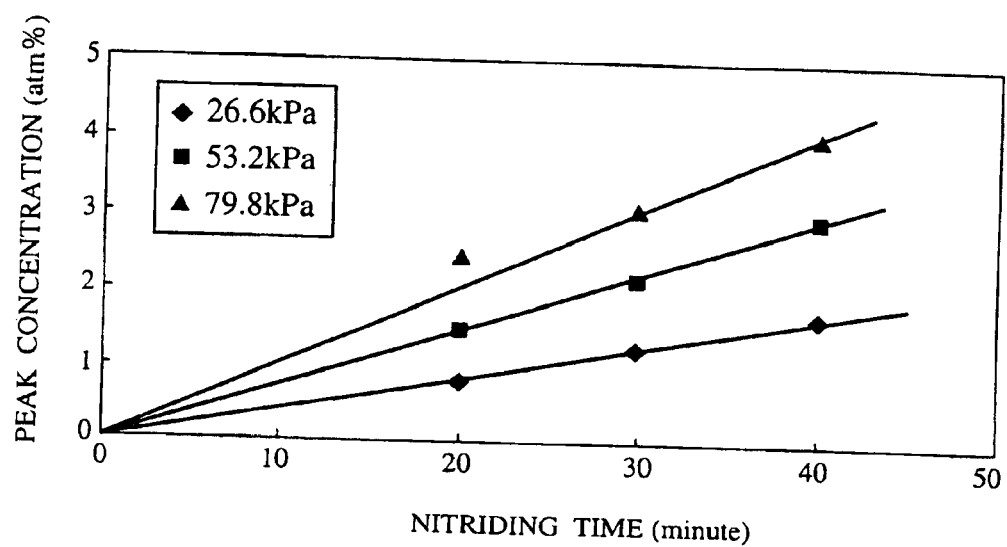
FIG. 7 is a graph showing a relationship between a nitriding time and a peak nitrogen concentration according to the first embodiment.

FIG. 7 is a graph showing a relationship between a nitriding time and a peak nitrogen concentration according to the first embodiment. An abscissa represents a time for supplying an $N_2O$ gas into a reactive tube, i.e., a film forming time of the nitrogen-containing oxide film 6. An ordinate represents a peak nitrogen concentration of the film 6 measured by SIMS. In FIG. 7, a film forming temperature of 900° C. is unchanged with film forming pressure being changed to 26.6 kPa, 53.2 kPa, and 79.8 kPa. It is understood from FIG. 7 that the film forming time is in proportion to the peak nitrogen concentration, and the peak nitrogen concentration is dependent on the film forming pressure. Namely, as the film forming pressure is increased, the peak nitrogen concentration increases. By changing the film forming conditions, a required nitrogen concentration is obtainable. For example, the film forming time may be extended over 40 minutes, or the film forming pressure may be controlled to 79.8 kPa, to form a nitrogen-containing oxide film having a peak nitrogen concentration of 4 atm % or above.

Second Embodiment

Figure 8:
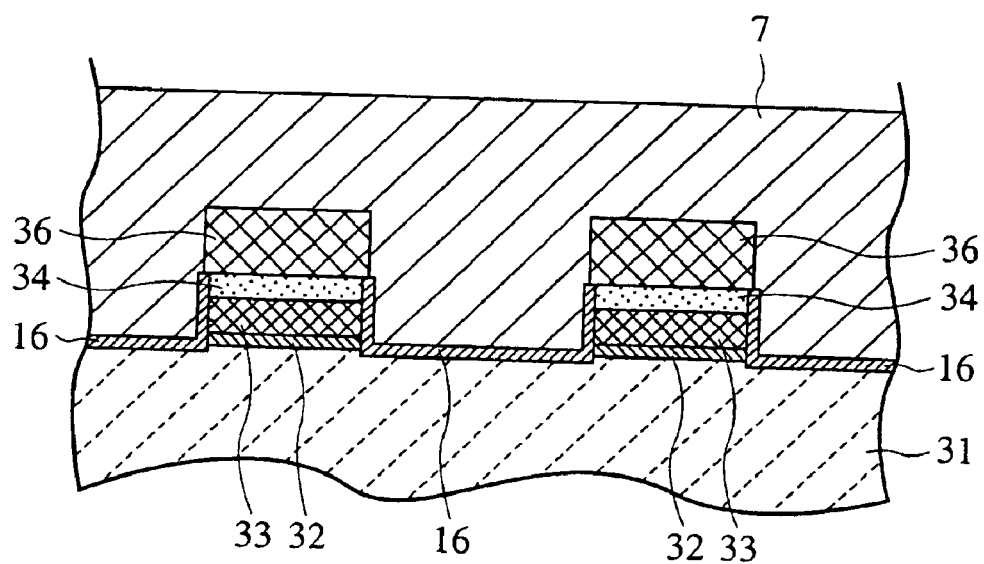
FIG. 8 is a sectional view showing a semiconductor device according to a second embodiment of the present invention.

FIG. 8 is a sectional view showing a semiconductor device according to the second embodiment. On a silicon substrate 31, a gate insulating film 32 is formed. On the gate insulating film 32, a gate electrode is formed. The gate electrode consists of a first conductive film 33 made of polysilicon or polycrystalline silicon, and a second conductive film 34 made of refractory metal or a silicide of refractory metal. On the gate electrode, a silicon nitride film 36 is formed. To cover the substrate 31 and films 32 to 34, a nitrogen-containing oxide film 16 is formed. On the films 16 and 36, a BPSG film 7 is formed. The films 16 and 36 prevent the oxidization of the substrate 31 and films 33 and 34. No hydrogen diffuses into the film 32, or no boron and phosphorus diffuse into the substrate 31 and conductive film 33. Although the film 36 contains hydrogen, the distance between the film 36 and the film 32 prevents the hydrogen from diffusing into the film 32.

A method of manufacturing the semiconductor device of the second embodiment differs from that of the first embodiment in that the second embodiment forms the silicon nitride film 36 instead of the silicon oxide film 35 and employs an NO gas to form the film 16 instead of the $N_2O$ gas used to form the film 6. The details of the method of the second embodiment will be explained.

(1) Based on the steps explained with reference to FIG. 6A, a gate insulating film 32 and conductive films 33 and 34 are formed on a silicon substrate 31. On the conductive film 34, a silicon nitride film 36 is formed by thermal CVD. A resist film is formed and is patterned into gate electrodes by photolithography. The patterned resist is used as a mask to dry-etch the films 32 to 34 and 36 by reactive ion etching.

Figure 9A:
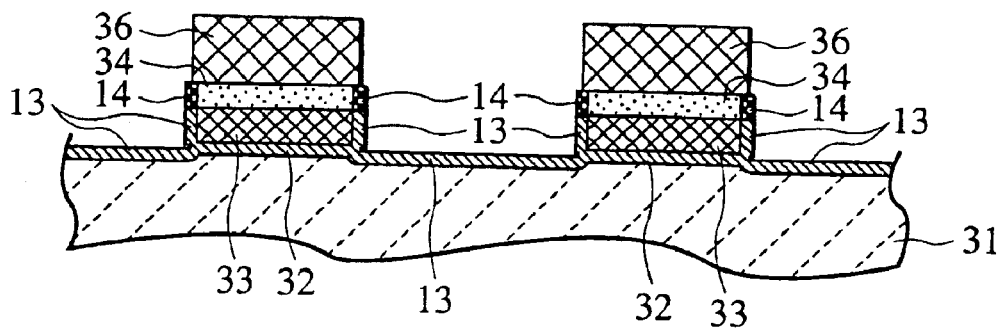
FIGS. 9A to 9C are sectional views showing a method of manufacturing the semiconductor device of the second embodiment.

(2) In FIG. 9A, a thermal oxide film is formed to a thickness of 5 nm on the substrate 31 in an oxygen atmosphere at 800° C. The exposed surfaces of the substrate 31 and conductive film 33 are oxidized to form an oxide film 13. Each side wall of the conductive film 34 is oxidized to form an oxide film 14. The film 36 is not further oxidized. The edges of an interface between the conductive film 33 and the insulating film 32 are not oxidized. This is because an oxidizing rate at the edges is small and a target film thickness is thin, and therefore, an oxidizing speed at the edges is not fast compared with oxidizing speeds at the other parts.

Figure 9B:
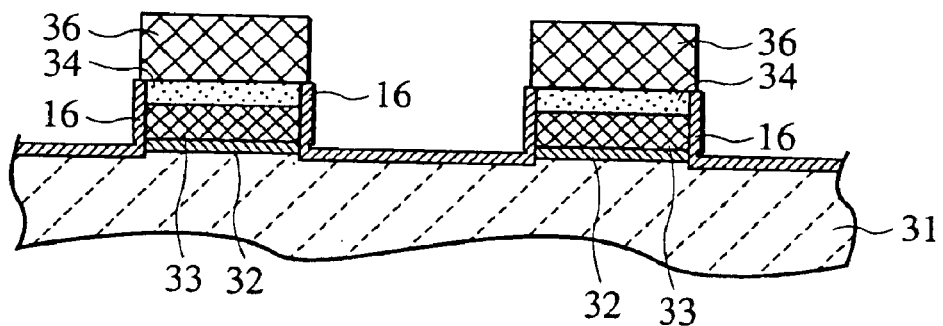

(3) In FIG. 9B, the exposed oxide films 13 and 14 are nitrided to form a nitrogen-containing oxide film 16. This process is carried out by controlling a reactive tube at a substrate temperature of 800° C. and a pressure of 53.2 kPa and by supplying an NO gas into the reactive tube for 30 minutes. At this time, the NO gas contributes nothing to oxidization, and therefore, the oxide films 13 and 14 will never be thickened. On the other hand, nitrogen is captured by the oxide films 13 and 14, and nitrogen concentrations in the films 13 and 14 increase as the supplying time of the NO gas is elongated. The amount of nitrogen captured by the oxide films 13 and 14 per a unit time is dependent on the temperature and pressure of this process. Accordingly, peak nitrogen concentrations in the oxide films 13 and 14 are controllable by adjusting these conditions. The material gas to form the nitrogen-containing oxide film 16 contains no hydrogen atoms, and therefore, the film 16 contains no hydrogen. Nitrogen diffuses into the exposed surfaces of the oxide films 13 and 14, to form the film 16. However, nitrogen does not diffuse into the film 32 just under the film 33, and therefore, the film 32 is not nitrided. Since the film 36 is a nitride film, no film 16 is formed on the film 36. The thermal oxidization process and the nitriding process with NO gas may be carried out in the same apparatus or in separate apparatuses.

Figure 9C:
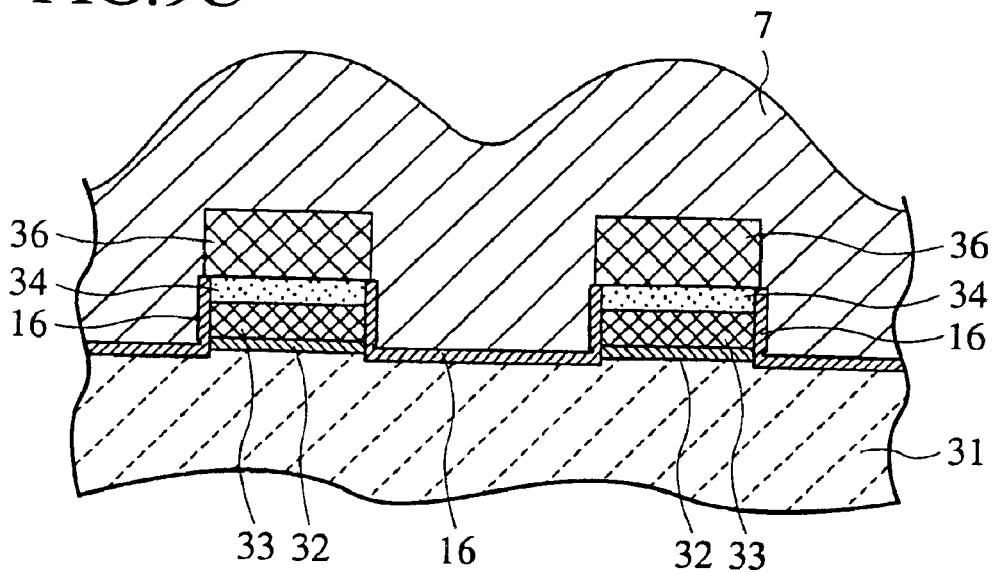

(4) In FIG. 9C, a BPSG film 7 is formed. A reflow process is carried out in a water vapor atmosphere as shown in FIG. 8, to flatten the top surface of the film 7. At this time, the nitrogen-containing oxide film 16 under the film 7 prevents oxidizing seeds from diffusing into an area between the substrate 31 and the film 16 as well as an area between the film 16 and the gate insulating film 32. This minimizes the oxidization of the substrate 31 and prevents an increase in the effective thickness of the gate insulating film 32.

Third Embodiment

Figure 10:
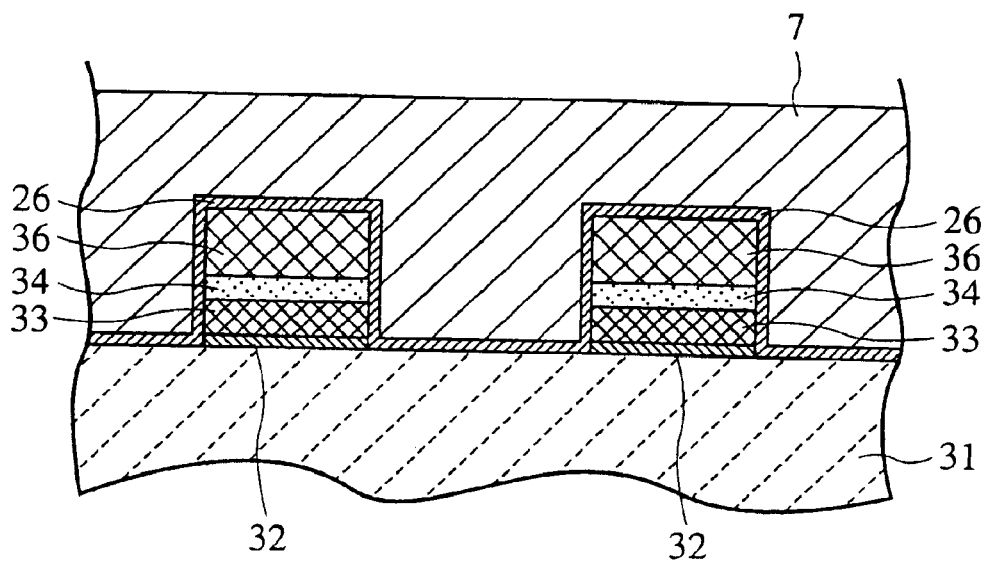
FIG. 10 is a sectional view showing a semiconductor device according to a third embodiment of the present invention.

FIG. 10 is a sectional view showing a semiconductor device according to the third embodiment of the present invention. On a silicon substrate 31, a gate insulating film 32 is formed. On the gate insulating film 32, a gate electrode is formed. The gate electrode consists of a first conductive film 33 made of polysilicon or polycrystalline silicon and a second conductive film 34 made of refractory metal or a silicide of refractory metal. On the gate electrode, a silicon nitride film 36 is formed. To cover the substrate 31 and films 32 to 34 and 36, a nitrogen-containing oxide film 26 is formed. On the film 26, a BPSG film 7 is formed. The film 26 prevents the oxidization of the substrate 31 and films 33 and 34. The film 26 also prevents hydrogen from diffusing into the film 32, or boron and phosphorus from diffusing into the substrate 31 and conductive film 33.

The third embodiment forms the nitrogen-containing oxide film 26 from an oxide film formed by LP-CVD (low pressure CVD). A method of manufacturing the semiconductor device of the third embodiment will be explained.

(1) Based on the steps explained with reference to FIG. 6A, a gate insulating film 32 and conductive films 33 and 34 are formed on a silicon substrate 31. On the conductive film 34, a silicon nitride film 36 is formed by thermal CVD. A resist film is formed and is patterned into gate electrodes by photolithography. The patterned resist is used as a mask to dry-etch the films 32 to 34 and 36 by reactive ion etching.

Figure 11A:
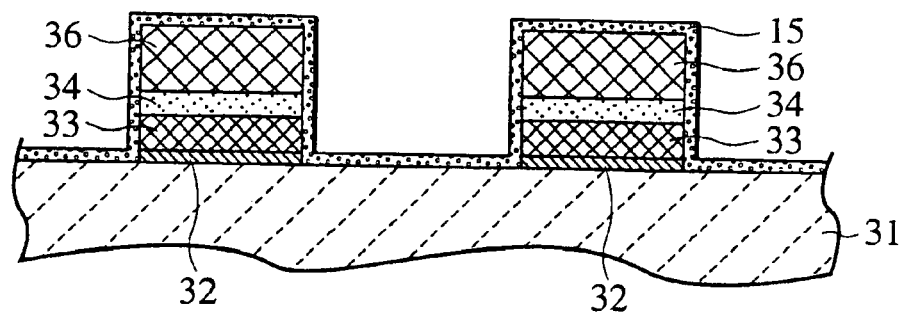
FIGS. 11A to 11C are sectional views showing a method of manufacturing the semiconductor device of the third embodiment.
Figure 11B:
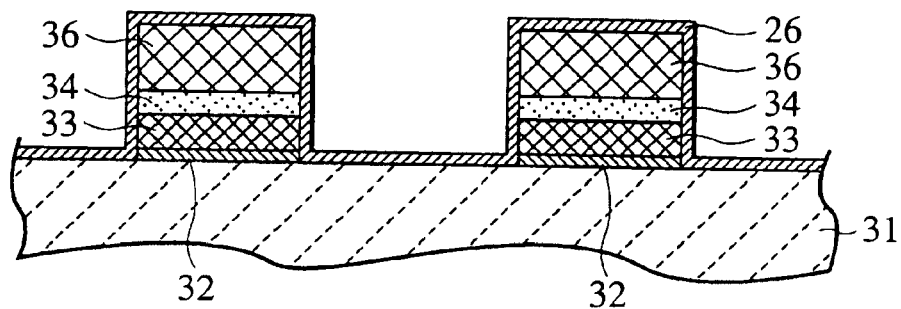

(2) In FIG. 11A, tetramethyl-orthosilicate (TEOS, $Si(OC_2H_5)_4$) and monosilane ($SiH_4$) are used as material gas to form a silicon oxide film 15 to a thickness of about 5 nm by LP-CVD at about 800° C. The oxide film 15 is uniformly formed on the exposed surface. In FIG. 11B, the oxide film 15 is nitrided like the second embodiment, to form a nitrogen-containing oxide film 26. Although the TEOS and monosilane used to form the oxide film 15 contain hydrogen atoms, the nitrogen-containing oxide film 26 formed from the oxide film 15 contains substantially no hydrogen atoms.

Figure 11C:
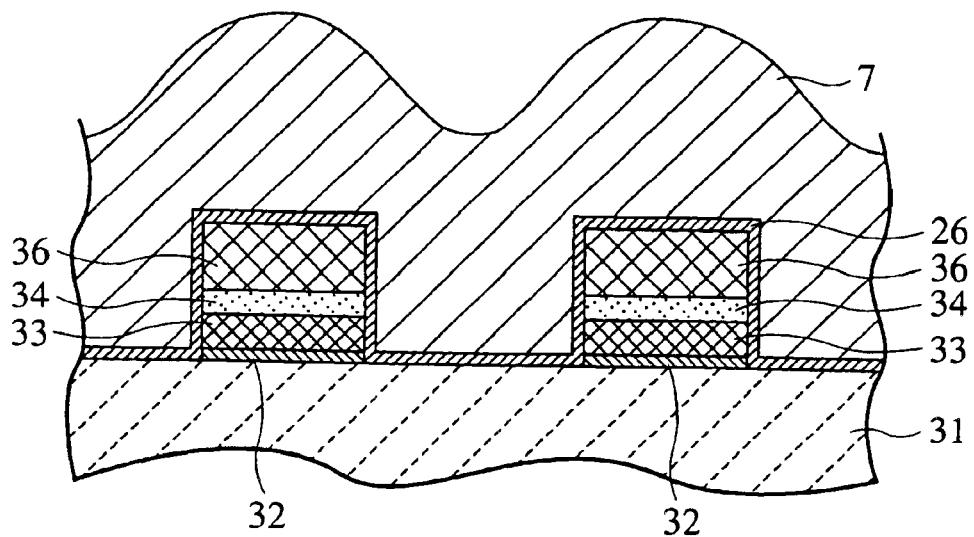

(3) In FIG. 11C, a BPSG film 7 is formed like the first embodiment. As shown in FIG. 10, a reflow process is carried out in a water vapor atmosphere like the first embodiment. At this time, the nitrogen-containing oxide film 26 under the BPSG film 7 prevents oxidizing seeds from diffusing into an area between the film 26 and the substrate 31 as well as an area between the film 26 and the conductive films 33 and 34. This results in minimizing the oxidization of the substrate 31 and preventing an increase in the effective thickness of the gate insulating film 32.

Fourth Embodiment

Figure 12:
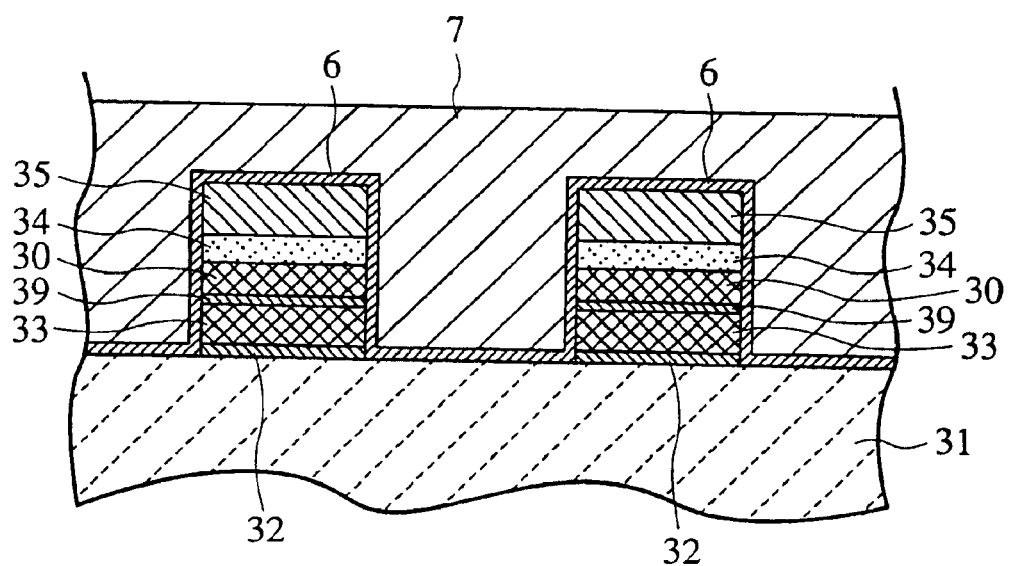
FIG. 12 is a sectional view showing a flash memory according to a fourth embodiment of the present invention.

FIG. 12 is a sectional view showing a semiconductor device according to the fourth embodiment of the present invention. This device is, for example, a flash memory having a double gate. On a silicon substrate 31, a gate insulating film 32 is formed. On the gate insulating film 32, a first conductive film 33 made of polysilicon or polycrystalline silicon serving as a floating gate is formed. On the conductive film 33, an oxide film 39 is formed. On the oxide film 39, a control gate is formed. The control gate consists of a third conductive film 30 made of polysilicon or polycrystalline silicon, and a second conductive film 34 made of refractory metal or a silicide of refractory metal. On the control gate, an oxide film 35 is formed. To cover the substrate 31 and films 32, 33, 39, 30, 34, and 35, a nitrogen-containing oxide film 6 is formed. On the film 6, a BPSG film 7 is formed.

A method of manufacturing the semiconductor device of the fourth embodiment at least includes the steps of forming the nitrogen-containing oxide film 6 over the silicon substrate 31 for providing semiconductor regions, forming the BPSG film 7 on the film 6, and heat-treating the BPSG film 7 in an oxidizing atmosphere. The step of forming the film 6 employs an $N_2O$ gas. The details of the method will be explained.

Figure 13A:
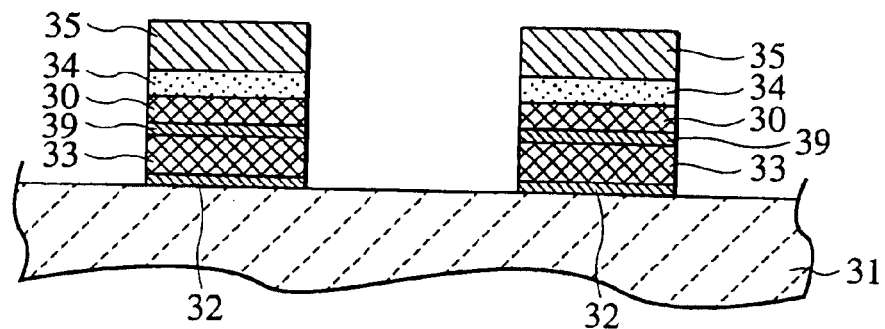
FIGS. 13A to 13C are sectional views showing a method of manufacturing the flash memory of the fourth embodiment.

(1) In FIG. 13A, a silicon substrate 31 is thermally oxidized to form a gate insulating film 32. On the film 32, a polysilicon film serving as the conductive film 33 is formed by LP-CVD. On the film 33, a silicon oxide film serving as the insulating film 39 is formed by LP-CVD. On the film 39, a polysilicon film serving as the conductive film 30 is formed by LP-CVD. On the film 30, a tungsten silicide film serving as the conductive film 34 is formed by CVD. On the film 34, a silicon oxide film 35 is formed by LP-CVD. A resist mask is used to dry-etch the films 35 to 32. A resist is patterned by photolithography, to form gate electrodes. The patterned resist is used as a mask to dry-etch the films 30, 32 to 35, and 39 by reactive ion etching.

Figure 13B:
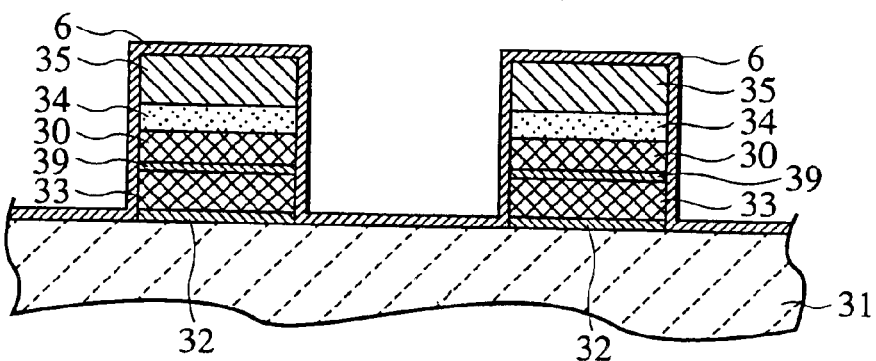

(2) In FIG. 13B, a nitrogen-containing oxide film 6 is formed to a thickness of, for example, 5 nm on the substrate 31 like the first embodiment, so that the film 6 may have a peak nitrogen concentration of about 2 atm %. The film 6 is formed by material gas containing no hydrogen atoms, and therefore, the film 6 contains no hydrogen atoms.

Figure 13C:
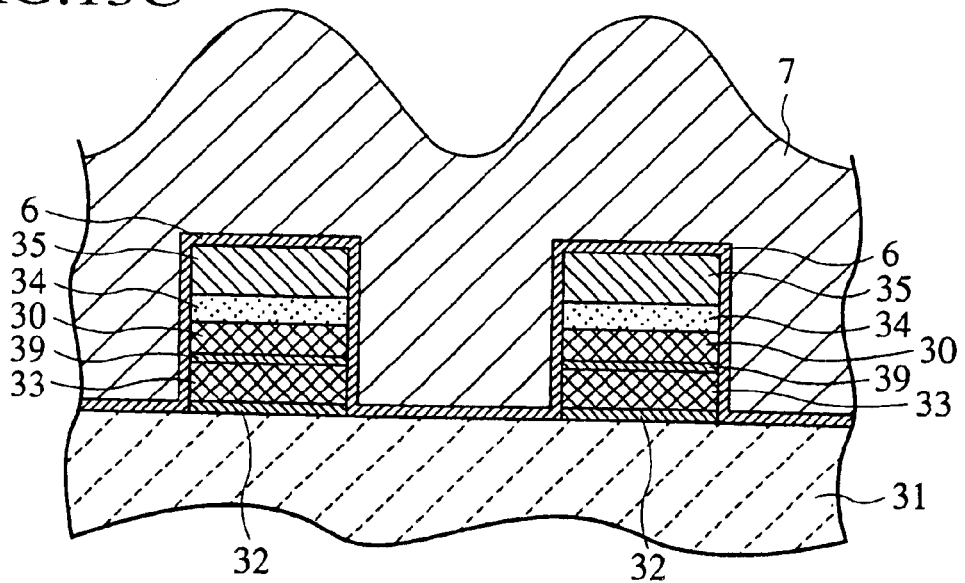

(3) In FIG. 13C, a BPSG film 7 is formed like the first embodiment. As shown in FIG. 12, a heat treatment is carried out in a water vapor atmosphere like the first embodiment. The nitrogen-containing oxide film 6 under the BPSG film 7 prevents oxidizing seeds from diffusing into an area between the film 6 and the substrate 31 as well as an area between the film 6 and the conductive films 33, 30, and 34. This results in minimizing the oxidization of the substrate 31 and preventing an increase in the effective thickness of each of the insulating films 32 and 39. Hydrogen that diffuses through the BPSG film 7 is blocked by the film 6, so that the hydrogen never diffuses into the insulating films 32 and 39.

Fifth Embodiment

Figure 14:
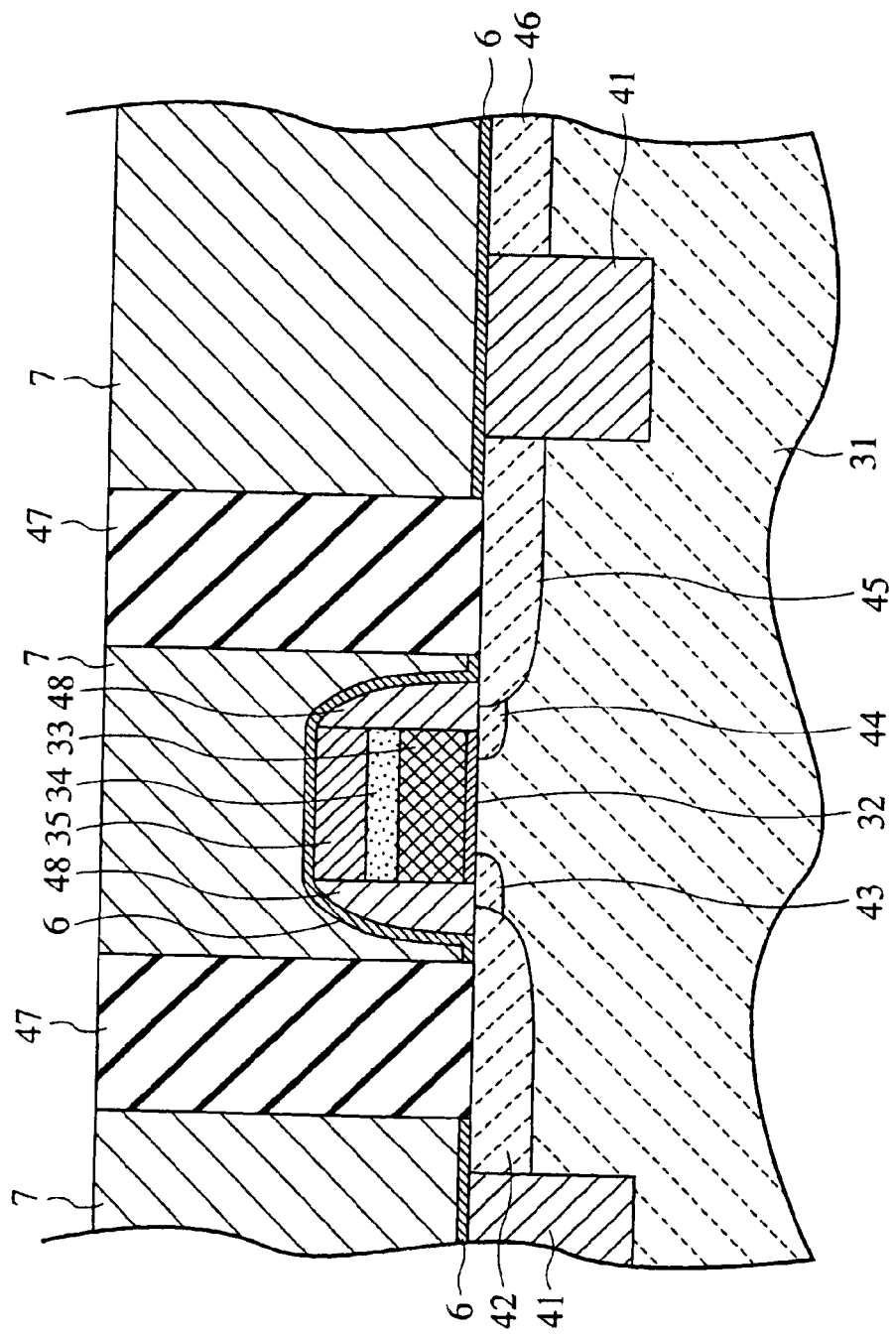
FIG. 14 is a sectional view showing a semiconductor device according to a fifth embodiment of the present invention.

FIG. 14 is a sectional view showing a semiconductor device according to the fifth embodiment of the present invention. This device has a metal insulated semiconductor (MIS) transistor. A silicon substrate 31 is of a first conductivity type and has an active region that is surrounded by an insulator 41 serving as an element separator. At the surface of the active region, the MIS transistor has a source region 42, a drain region 45, and lightly-doped drain (LDD) regions 43 and 44 of a second conductivity type. A region 46 is a source or drain region of an adjacent transistor. A channel region is present between the regions 43 and 44. Over the channel region, a gate insulating film 32 is formed. On the gate insulating film 32, a gate electrode is formed. The gate electrode consists of a first conductive film 33 made of polysilicon or polycrystalline silicon, and a second conductive film 34 made of refractory metal or a silicide of refractory metal. On the gate electrode, a silicon oxide film 35 is formed. To cover the side faces of the films 32 to 35, a silicon oxide film 48 serving as a side-wall spacer is formed. On the insulator 41, source region 42, drain region 45, and silicon oxide films 35 and 48, a nitrogen-containing oxide film 6 is formed. On the film 6, a BPSG film 7 is formed. A conductor 47 is formed through the films 6 and 7, to contact with the source region 42 or drain region 45. The conductor 47 is connected to a higher wiring layer. The first and second conductivity types are opposite conductivity types. If the first conductivity type is "n," the second conductivity type is "p." If the first conductivity type is "p," the second conductivity type is "n."

A method of manufacturing the semiconductor device of the fifth embodiment will be explained.

Figure 15A:
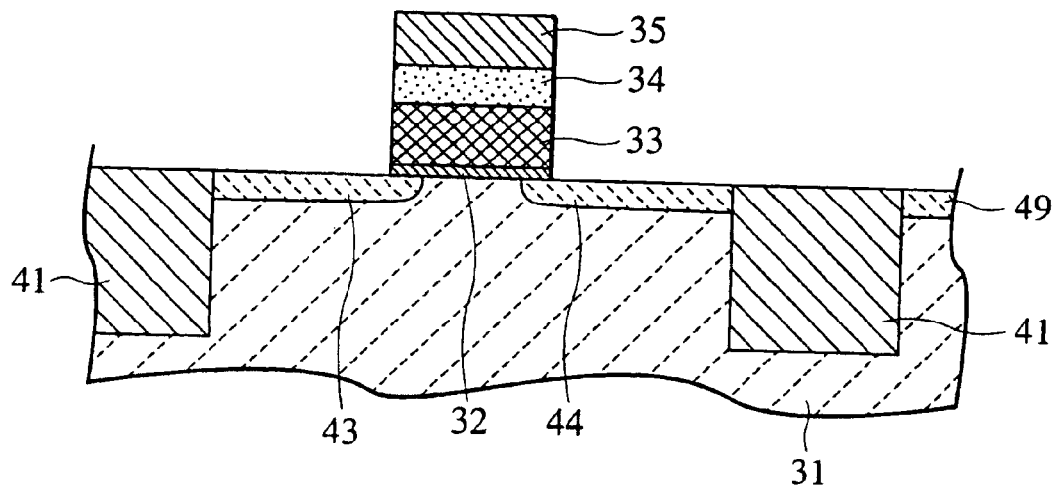
FIGS. 15A and 15B are sectional views showing a method of manufacturing the semiconductor device of the fifth embodiment.

(1) In FIG. 15A, trenches are formed on the surface of a p-type silicon substrate 31 by photolithography and RIE. The trenches are filled with insulating material, which is processed by chemical mechanical polishing (CMP) to form an insulator 41 for shallow trench isolation. A thermal oxide film is formed as the gate insulating film 32. A phosphorus-doped n-type polysilicon film serving as the first conductive film 33 is formed by thermal CVD. A $WSi_2$ film serving as the second conductive film 34 is formed by spattering. A silicon oxide film 35 is formed by plasma CVD. A resist film is formed and is patterned by photolithography into gate electrodes. The patterned resist is used as a mask to dry-etch the films 32 to 35 by RIE.

(2) The oxide film 35 is used as a mask to implant arsenic ions ($^{75}As^+$), and a heat treatment is carried out to form LDD regions 43, 44, and 49. A silicon oxide film is formed by LP-CVD and is etched back to form a side-wall spacer oxide film 48. The oxide films 35 and 48 are used as masks to implant phosphorus ions ($^{31}P^+$), and a heat treatment is carried out to form n-type source and drain regions 42, 45, and 46.

Figure 15B:
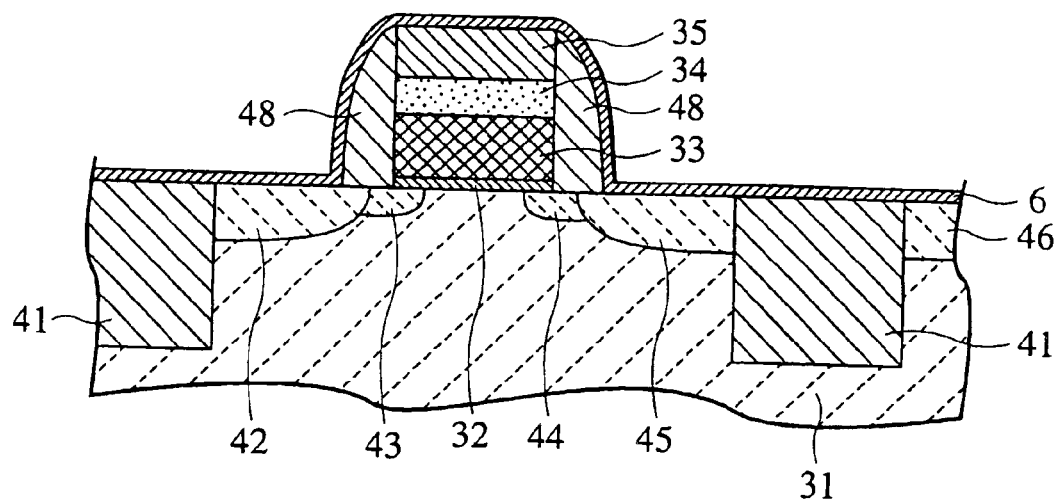

(3) In FIG. 15B, a nitrogen-containing oxide film 6 is formed to a thickness of, for example, 5 nm on the silicon substrate 31 like the first embodiment. More precisely, the exposed surfaces of the regions 42, 45, and 46 are nitrided and oxidized to form the film 6, and nitrogen is diffused into the exposed surfaces of the films 41, 48, and 35 to form the film 6.

(4) As shown in FIG. 14, a BPSG film 7 is formed to a thickness of, for example, about 900 nm by thermal CVD. A reflow process is carried out in a water vapor atmosphere at 750° C. for 30 minutes. At this time, the nitrogen-containing oxide film 6 under the BPSG film 7 prevents the diffusion of oxidizing seeds. This minimizes the oxidization of the substrate 31 and prevents an increase in the effective thickness of the gate insulating film 32. Photolithography and RIE are used to open holes through the BPSG film 7 and nitrogen-containing oxide film 6 up to the regions 42 and 45. Each hole is filled with conductive material such as tungsten (W) and titanium nitride ($TiN_2$) polysilicon by thermal CVD. The conductive material on the film 7 is removed by CMP, to complete the conductor 47 serving as a plug.

First Modification of Fifth Embodiment

Figure 16A:
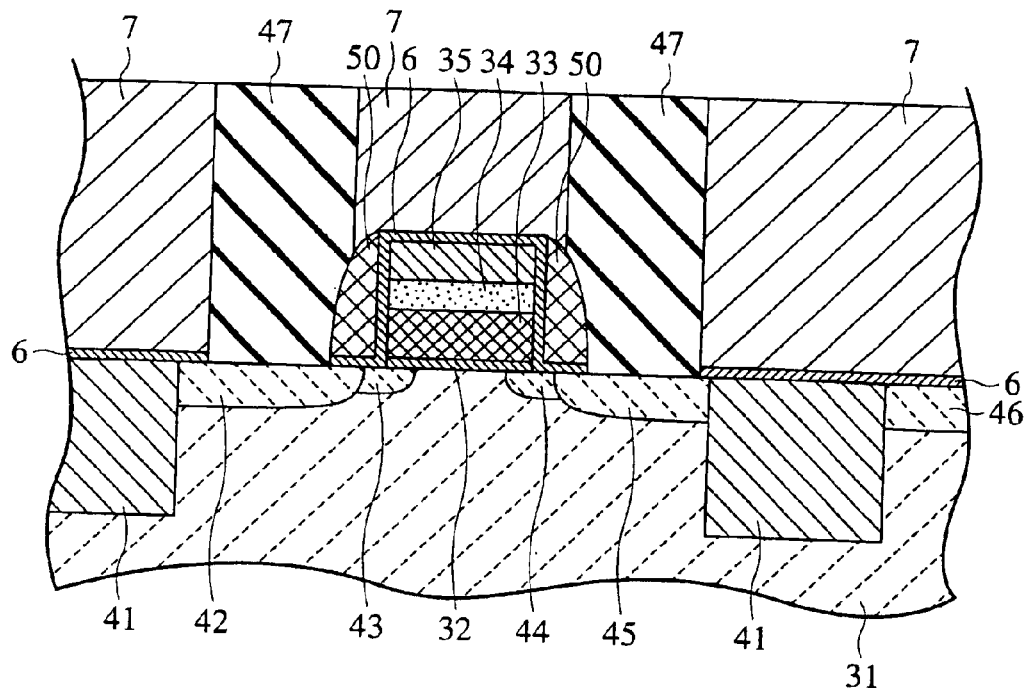
FIG. 16A is a sectional view showing a semiconductor device according to a first modification of the fifth embodiment.

FIG. 16A is a sectional view showing a semiconductor device according to the first modification of the fifth embodiment. In FIG. 14, the conductive films 33 and 34 and insulating film 32 are in contact with the silicon oxide film 48 serving as a side-wall spacer, and the nitrogen-containing oxide film 6 is formed outside the film 48. On the other hand, the device of FIG. 16A has conductive films 33 and 34 and an insulating film 32 that are in contact with a nitrogen-containing oxide film 6. Outside the film 6, there is a silicon nitride film 50 serving as a side-wall spacer. A side face of a plug 47 aligns with a side face of the film 50. The film 6 of this structure prevents hydrogen contained in the film 50 from diffusing into the film 32. In addition, the position of the plug 47 is determined by self alignment.

The difference between the fifth embodiment and the first modification in manufacturing a semiconductor device will be explained. Steps up to forming LDD regions 43, 44, and 49 are the same.

Figure 16B:
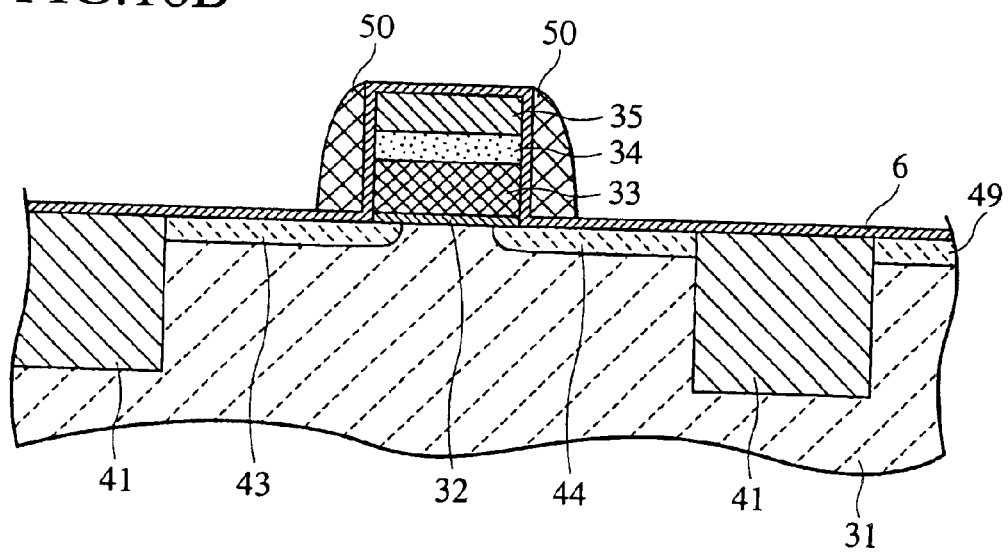
FIG. 16B is a sectional view showing a method of manufacturing the semiconductor device of the first modification.

(1) In FIG. 16B, a nitrogen-containing oxide film 6 is formed to a thickness of, for example, 5 nm on the regions 43 and 44 like the first embodiment. More precisely, the exposed faces of the films 33 and 34 and regions 43, 44, and 49 are nitrided and oxidized to form the film 6, and nitrogen is diffused into the exposed faces of the films 41, 32, and 35 form the film 6. A silicon nitride film is formed by LP-CVD and is etched back to form a side-wall spacer nitride film 50. The etching back is stopped on the film 6.

(2) In FIG. 16A, the oxide film 35 and nitride film 50 are used as masks to implant phosphorus ions ($^{31}P^+$), and a heat treatment is carried out to form n-type source and drain regions 42, 45, and 46. A BPSG film 7 is formed, and a reflow process is carried out like the fifth embodiment. At this time, the nitrogen-containing oxide film 6 under the BPSG film 7 prevents the diffusion of oxidizing seeds, to minimize the oxidization of the substrate 31 and prevent an increase in the effective thickness of the gate insulating film 32.

(3) Photolithography and RIE are used to open holes through the BPSG film 7 and nitrogen-containing oxide film 6 up to the regions 42 and 45. When carrying out RIE, it is set to select the BPSG film 7 prior to the nitride film 50, so that each hole is opened along the film 50. A conductor 47 serving as a plug is formed in each hole like the fifth embodiment. The distance between the gate electrode and the plug is determined by the side-wall spacer 50 without regard to the correctness of the photolithography for opening the holes.

Second Modification of Fifth Embodiment

Figure 17A:
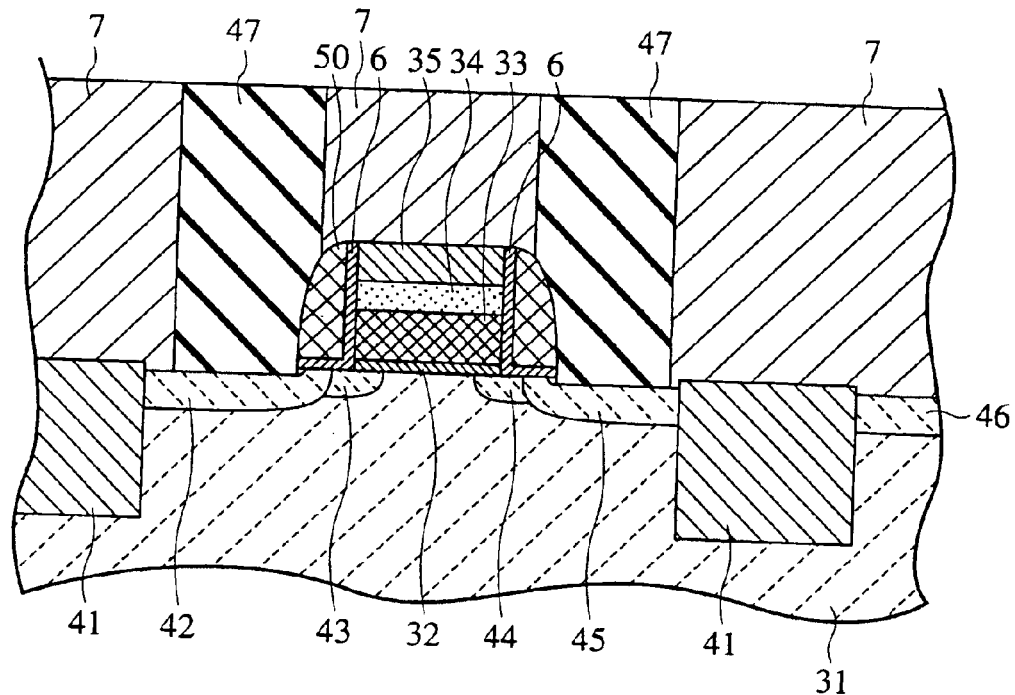
FIG. 17A is a sectional view showing a semiconductor device according to a second modification of the fifth embodiment.

FIG. 17A is a sectional view showing a semiconductor device according to the second modification of the fifth embodiment. Unlike the first modification of FIG. 16A in which the nitrogen-containing oxide film 6 is formed on the films 35 and 41, the second modification of FIG. 17A forms no film 6 on films 35 and 41. This arrangement also prevents hydrogen contained in a film 50 from diffusing into a film 32. The position of a plug 47 is determined in a self-aligning manner.

Figure 17B:
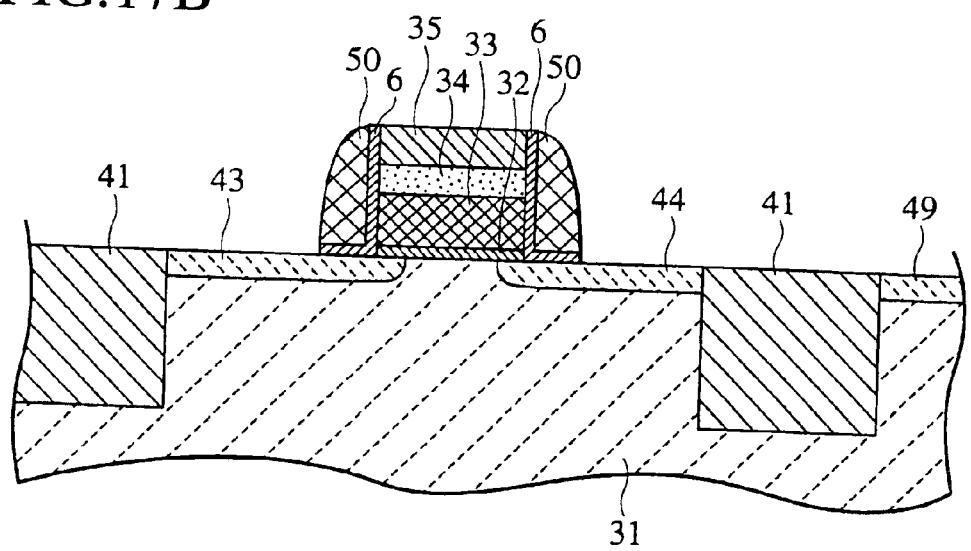
FIG. 17B is a sectional view showing a method of manufacturing the semiconductor device of the second modification.

The difference between the first and second modifications in forming a semiconductor device will be explained. Steps up to forming a silicon nitride film by LP-CVD and etching back the same to form a side-wall spacer nitride film 50 are the same. In FIG. 17B, the second modification does not stop the etching back on the nitrogen-containing oxide film 6 but etches even the film 6. Since there is no need of stopping the etching back at the film 6, the second modification relaxes etching conditions. The removed part of the film 6 exposes the regions 42, 45, and 46. These exposed parts are oxidized during a reflow process. However, the LDD regions 43 and 44, the channel region, an interface between the films 32 and 33, and the side faces of the film 33 are protected by the film 6, and therefore, are not oxidized.

Other Embodiments

Various modifications will become possible for those skilled in the art after receiving the teachings of the present disclosure without departing from the scope thereof.

The above embodiments form a nitrogen-containing oxide film 6 around a gate electrode. Instead, a nitrogen-containing oxide film may be formed to serve as a gate insulating film 32. In this case, the nitrogen-containing oxide film is left as it is when dry-etching gate electrodes. This also provides the effect of preventing the oxidization of a silicon substrate.

The present invention is applicable not only to a reflow process on a BPSG film but also to a reflow process on a phosphorus silicate glass (PSG). Since the nitrogen-containing oxide film of the present invention prevents the diffusion of oxygen, it may prevent the diffusion of copper (Cu). When copper wiring is prepared, copper diffuses into a silicon oxide film and penetrates a silicon substrate. The nitrogen-containing oxide film of the present invention may prevent such diffusion of copper.

In this way, various modifications are possible based on the embodiments mentioned above, and therefore, it should be understood that such modifications are also covered by the present invention and that the scope of the present invention is defined only by appended claims.

In summary, the present invention provides a semiconductor device that enables a reflow process on an interlayer insulating film such as a BPSG film to be carried out in a water vapor atmosphere without deteriorating the reliability of a gate insulating film of the semiconductor device.

The present invention also provides a method of manufacturing a semiconductor device that enables a reflow process on an interlayer insulating film such as a BPSG film to be carried out in a water vapor atmosphere without deteriorating the reliability of a gate insulating film of the semiconductor device.

What is claimed is:

1. A method of manufacturing a semiconductor device, comprising:

forming an insulating film on a semiconductor substrate;

forming a conductive film on the insulating film;

forming a nitrogen-containing oxide film directly adjacent to the conductive film and over the semiconductor substrate and the insulating film;

forming a boron-doped phosphorus silicate glass (BPSG) film over the nitrogen-containing oxide film; and carrying out a heat treatment on the BPSG film in an oxidizing atmosphere.

2. The method of claim 1, wherein forming a nitrogen-containing oxide film includes carrying out a heat treatment in a dinitrogen monoxide ($N_2O$) gas.

3. The method of claim 1, wherein forming a nitrogen-containing oxide film includes:

forming a thermal oxide film on exposed surfaces of the semiconductor substrate and conductive film; and heat-treating the thermal oxide film in a dinitrogen monoxide ($N_2O$) gas or a nitric monoxide (NO) gas.

4. The method of claim 1, wherein forming a nitrogen-containing oxide film includes:

forming a silicon oxide film on exposed surfaces of the semiconductor substrate, insulating film, and conductive film; and heat-treating the silicon oxide film in a dinitrogen monoxide ($N_2O$) gas or a nitric monoxide (NO) gas.

5. The method of claim 1, wherein the oxidizing atmosphere contains water vapor.

6. A semiconductor device manufactured by the method of claim 1.

7. The method of claim 1, wherein the conductive film comprises two layers.

8. The method of claim 7, wherein the conductive film comprises a layer of at least one of polysilicon or polycrystallinesilicon, and a layer comprising at least one of refractory metal or suicide of a refractory metal.

9. A method of manufacturing a semiconductor device, comprising forming an insulating film on a semiconductor substrate;

forming a conductive film on the insulating film;

forming a nitrogen-containing oxide film in the absence of hydrogen over the semiconductor substrate, the insulating film, and the conductive film;

forming a boron-doped phosphorus silicate glass (BPSG) film after the nitrogen-containing oxide film; and carrying out a heat treatment on the BPSG film in an oxidizing atmosphere.

10. The method of claim 9, wherein forming a nitrogen-containing oxide film includes carrying out a heat treatment in a dinitrogen monoxide ($N_2O$) gas.

11. The method of claim 9, wherein forming a nitrogen-containing oxide film includes:

forming a thermal oxide film on exposed surfaces of the semiconductor substrate and conductive film; and heat-treating the thermal oxide film in a dinitrogen monoxide ($N_2O$) gas or a nitric monoxide (NO) gas.

12. The method of claim 9, wherein forming a nitrogen-containing oxide film includes:

forming a silicon oxide film on exposed surfaces of the semiconductor substrate, insulating film, and conductive film; and heat-treating the silicon oxide film in a dinitrogen monoxide ($N_2O$) gas or a nitric monoxide (NO) gas.

13. The method of claim 9, wherein the oxidizing atmosphere contains water vapor.

14. A semiconductor device manufactured by the method of claim 9.

* * * * *